(12) United States Patent
Akiyoshi et al.

(10) Patent No.: US 7,579,054 B2
(45) Date of Patent: Aug. 25, 2009

(54) SUBSTRATE FOR FLEXIBLE DISPLAYS

(75) Inventors: Kazunori Akiyoshi, Niihama (JP); Kyoko Yamamoto, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 141 days.

(21) Appl. No.: 11/570,684

(22) PCT Filed: Jun. 9, 2005

(86) PCT No.: PCT/JP2005/010984

§ 371 (c)(1),
(2), (4) Date: Dec. 15, 2006

(87) PCT Pub. No.: WO2006/001207

PCT Pub. Date: Jan. 5, 2006

(65) Prior Publication Data

US 2007/0224366 A1    Sep. 27, 2007

(30) Foreign Application Priority Data

Jun. 25, 2004   (JP) .............................. 2004-187629

(51) Int. Cl.
*C09K 19/00*    (2006.01)
*C09K 19/06*    (2006.01)
*C09K 19/52*    (2006.01)

(52) U.S. Cl. .................... 428/1.5; 428/1.1; 252/299.01; 252/299.6; 430/20; 430/270.1

(58) Field of Classification Search ............ 252/299.01, 252/299.6; 430/20, 270.1; 428/1.1, 1.5
See application file for complete search history.

(56) References Cited

U.S. PATENT DOCUMENTS

| 5,969,029 | A | 10/1999 | Kotani et al. |
| 7,371,425 | B2 * | 5/2008 | Rathenow et al. .......... 427/2.24 |

FOREIGN PATENT DOCUMENTS

| JP | 10-293293 A | 11/1998 |
| JP | 2001-217438 A | 8/2001 |
| JP | 2002-246627 A | 8/2002 |
| JP | 2002-287121 A | 10/2002 |
| JP | 2002-297054 A | 10/2002 |
| JP | 2003-105214 A | 4/2003 |
| JP | 2003-125315 A | 4/2003 |
| JP | 2003-168556 A | 6/2003 |
| JP | 2003-216060 A | 7/2003 |
| JP | 2004-077784 A | 3/2004 |
| JP | 2004-117937 A | 4/2004 |
| JP | 2004-130709 A | 4/2004 |
| JP | 2004-176032 A | 6/2004 |

* cited by examiner

*Primary Examiner*—Geraldina Visconti
(74) *Attorney, Agent, or Firm*—Sughrue Mion, PLLC

(57) ABSTRACT

The present invention provides a substrate for flexible displays, a method for producing the same, and a flexible display. The substrate for flexible displays comprises a resin composition layer containing an inorganic layered compound and a resin, wherein the amount of the inorganic layer compound is not less than 10 weight % and not more than 70 weight % based on the total amount of the resin and the inorganic layer compound. The method for producing a substrate for flexible displays comprises applying a mixture of a solvent, an inorganic layer compound, and a resin to a plate, drying the mixture, and peeling off the resulting layer from the plate. The display comprises the above substrate for flexible displays and electrodes.

14 Claims, No Drawings

SUBSTRATE FOR FLEXIBLE DISPLAYS

TECHNICAL FIELD

The present invention relates to a substrate for flexible displays, a method for producing the substrate, and a flexible display.

BACKGROUND ART

Flexible displays are one of displays such as liquid crystal displays and organic EL displays. Since flexible displays can also be placed on the curved surfaces of the enclosures of display devices, the displays are expected to find wide application.

Flexible displays each include a substrate, a transparent electrode formed on the substrate, and a display material in general. As examples of the substrate, polyethylene terephthalate, polycarbonate, polyolefin, polyethersulfone are known (JP-A No. 2003-17244).

However, the substrates have high thermal expansion coefficients, and therefore in flexible displays using the substrates, electric resistance of the transparent electrode is increased, and the transparent electrode wire disconnection is caused at times because the transparent electrode is cracked due to ambient temperature changes.

DISCLOSURE OF THE INVENTION

An object of the present invention is to provide a substrate which has sufficient flexibility and a low thermal expansion coefficient and which is suitable for flexible displays.

The present inventors conducted extensive studies on a substrate which has a low thermal expansion coefficient and which can be used for the production of a flexible display and as a result of this, the present invention has been accomplished.

That is, the present invention provides a substrate for flexible displays comprising a resin composition layer containing an inorganic layer compound and a resin, wherein the amount of the inorganic layer compound is not less than 10 weight % and not more than 70 weight % based on the total amount of the resin and the inorganic layer compound.

Further, the invention provides a display comprising the above substrate for flexible displays and electrodes.

Furthermore, the invention provides the use of a resin composition comprising a resin composition layer containing a resin and an inorganic layer compound as a substrate for flexible displays, wherein the amount of the inorganic layer compound is not less than 10 weight % and not more than 70 weight % based on the total amount of the resin and the inorganic layer compound.

BEST MODE FOR CARRYING OUT THE INVENTION

Substrate for Flexible Displays

A substrate for flexible displays according to the present invention (hereinafter referred to as "substrate") has a resin composition layer which contains an inorganic layer compound and a resin.

The inorganic layer compound can be an inorganic compound having a layered structure in which unit crystal layers are stacked on top of each other. Preferably, the inorganic layer compound exhibits swellability and cleavability when mixed with a solvent. As an inorganic layer compound, a clay mineral is used which exhibits swellability and cleavability when mixed with a solvent. Examples of the clay mineral include smectite, kaolinite, dickite, nacrite, halloysite, antigorite, chrysotile, pyrophyllite, montmorillonite, hectorite, tetrasilylic mica, sodium taeniolite, muscovite, margarite, talc, vermiculite, phlogopite, xansophyllite, and chlorite. Among these, smectite, kaolinite, montmorillonite, hectorite, tetrasilylic mica, sodium taeniolite, and talc are preferable in terms of their dispersibility to the resin. The above inorganic layer compounds may be used alone or in combination.

The inorganic layer compound has an average particle diameter which is sufficiently smaller than the wavelength of visible light (about 400 nm to about 800 nm), for example, 300 nm or smaller. The inorganic layer compound has an average particle diameter of preferably not less than 50 nm, more preferably not less than 100 nm and preferably not more than 300 nm, more preferably not more than 200 nm. The substrate including the inorganic layer compound with the above average particle diameter has a low thermal expansion coefficient and a high visible light transmittance (for example, 80% or higher). The inorganic layer compound is dispersed into the solvent and the average particle diameter L (nm) of the inorganic layer compound may be measured by means of a dynamic light-scattering method.

The inorganic layer compound has an aspect ratio of usually not less than 50, preferably not less than 100 and usually not more than 300, preferably not more than 200. The inorganic layer compound having the aspect ratio within these ranges is easily oriented to the resin, and the resulting transparency of the substrate is also increased. The aspect ratio Z may be calculated from the following equation:

$$Z = L/a$$

Wherein L is the average particle diameter and a is a unit thickness determined from the diffraction peak of the inorganic layer compound measured by means of powder X-ray diffractometry.

In addition, the inorganic layer compound may have a particle shape and the inorganic layer compound particles may be oriented. For example, the inorganic layer compound may have a plate particle shape and its surface having maximum area may be substantially parallel to the surface of the substrate (for example, the display surface). In this specification, such orientation is referred to as "orientation in the surface direction". The substrate to which the inorganic layer compound is oriented in the surface direction has a lower thermal expansion coefficient in the surface direction.

The amount of the inorganic layer compound is not less than 10 wt %, preferably not less than 20 wt % and not more than 70 wt %, preferably not more than 60 wt % based on the total amount of the resin and the inorganic layer compound. Having the layer, the thermal expansion coefficient of the substrate becomes low. When the amount of the inorganic layer compound exceeds 70 wt %, there is a tendency that it becomes difficult to evenly disperse the inorganic layer compound into the resin.

As the resin, a thermoplastic resin may be used and a thermoplastic resin through which visible light passes completely is preferably used. Examples of the resin include: polyolefin such as low-density polyethylene, high-density polyethylene, ethylene-propylene copolymers, ethylene-butene copolymers, ethylene-hexene copolymers, ethylene-octene copolymers, ethylene-norbornene copolymers, ethylene-domone copolymers, polypropylene, ethylene-vinyl acetate copolymers, ethylene-methyl methacrylate copolymers, and ionomer resins; polyester such as polyethylene terephthalate, polybutylene terephthalate, and polyethylene naphthalate; amidic resins such as nylon 6, nylon 66, metaxylene diamine-adipic acid condensation polymers, polymethyl methacrylimide; acrylic resins such as polymethyl methacrylate; stylene-acrylonitrile resins such as polystyrene, styrene-acrylonitrile copolymers, styrene-acrylonitrile-butadiene copolymers, and polyacrylonitrile; hydrophobic cellulosic resins such as cellulose triacetate and cellulose diacetate; halogen-containing resins such as polyvinyl chloride, polyvinylidene chloride, polyvinylidene fluoride, and polytetrafluoro-ethylene; hydrogen-bondable resins such as polyvinyl alcohol, ethylene-vinyl alcohol copolymers, and cellulose derivatives; polycarbonate; polysulfone; polyether sulfone; polyether etherketone; polyphenylene oxide; polymethylene oxide; and liquid crystal polymers. As the resin, a resin having excellent heat resistance is preferably used, and therefore, for example, its glass transition temperature (Tg) is not less than 150° C., preferably not less than 180° C., and more preferably not less than 200° C. Examples of the resin having excellent heat resistance include ethylene-norbornene copolymers, ethylene-domone copolymers, polyethylene terephthalate, polyethylene naphthalate, cellulose triacetate, cellulose diacetate, polyvinylidene chloride, polyvinylidene fluoride, polytetrafluoro-ethylene, polyvinyl alcohol, ethylene-vinyl alcohol copolymers, polycarbonate, polysulfone, polyether sulfone, polyether etherketone, and liquid crystal polymers. These resins may be used alone or in combination.

The substrate comprising the resin composition layer containing the inorganic layer compound and the resin, has an average thermal expansion coefficient between 20° C. and 150° C. of usually not less than −10 ppm/° C., preferably not less than 0 ppm/° C. and usually not more than 25 ppm/° C., preferably not more than 20 ppm/° C.

Furthermore, the substrate having the aspect ratio, the average particle diameter, or the resin composition layer containing the oriented inorganic layer compound and the resin has a low average thermal expansion coefficient and a visible light transmittance of usually 80% or higher. This substrate is used as a substrate on the backside of a flexible display or a substrate on its frontside (a substrate on the side of display viewed).

As a layer other than the resin composition layer containing the inorganic layer compound and the resin, the substrate may have a resin layer containing no inorganic layer compound. It is preferable the resin layer containing no inorganic layer compound has a thickness thinner than the resin composition layer.

Furthermore, as a layer other than the resin composition layer containing the inorganic layer compound and the resin, it is preferable the substrate has at least one other resin composition layer containing an inorganic layer compound and a resin. The resin of the resin composition layer and that of the other resin composition layer may be of the same kind or of different kinds and are preferably of the same kind. When they are of the same kind, adhesion between the resin composition layer and the other resin composition layer is promoted.

When the substrate includes the resin composition layer and the other resin composition layer, the amount of the inorganic layer compound contained in the resin composition layer is not less than 10 wt %, preferably not less than 20 wt % and not more than 70 wt %, preferably not more than 60 wt % based on the total amount of the inorganic layer compound and the resin contained in the resin composition layer. On the other hand, the amount of the inorganic layer compound contained in the other resin composition layer is usually not less than 0.1 wt %, preferably not less than 0.3 wt % and not more than 10 wt %, preferably not more than 5 wt % based on the total amount of the inorganic layer compound and the resin contained in the other resin composition layer.

The substrate has a thickness of usually not less than 1 µm, preferably not less than 5 µm, more preferably not less than 10 µm and usually not more than 500 µm, preferably not more than 300 µm, more preferably not more than 250 µm. The substrate having the thickness within these ranges has sufficient flexibility, mechanical strength, and transparency. When the substrate includes the resin composition layer and the other resin composition layer, the thickness of each layer is usually not less than 0.5 µm, preferably not less than 1 µm, more preferably not less than 1.5 µm and usually not more than 200 µm, preferably not more than 150 µm, more preferably not more than 100 µm. It is preferable the resin composition layer (when the resin composition layer is formed plurally, the thickness means the sum of the thicknesses of the layers) has a the thickness thicker than the other resin composition layer (when the other resin composition layer is formed plurally, the thickness means the sum of the thicknesses of the layers).

The substrate may contain additives such as an ultraviolet absorber, a colorant, and an antioxidant.

Method for Producing Substrate

The above-described substrate may be produced using a method in which a mixture of a solvent, an inorganic layer compound, and a resin is applied to a plate, the mixture is dried, and a resulting layer is peeled off from the plate.

Examples of the solvent include water, alcohols (such as methanol), dimethyl formamide, dimethyl sulfoxide, dichloromethane, chloroform, toluene, acetone, and N-methyl pyrrolidone. As the inorganic layer compound, the above materials may be used. The inorganic layer compound is preferably surface-treated with, for example, a quaternary ammonium salt in terms of an increase in dispersibility. Further, as the resin, the above materials may be used. The total amount of the inorganic layer compound and the resin is usually not less than 5 wt %, preferably not less than 10 wt % and usually not more than 50 wt %, preferably not more than 35 wt % based on the amount of the solvent. When the total amount of the inorganic layer compound and the resin is within the above ranges, the substrate having the thickness described above can be made with ease.

The mixture of the inorganic layer compound, the resin, and the solvent may be produced by using, for example, the following methods 1 to 4 and preferably by using methods 1 to 3. Method 1: a solution prepared by dissolving the resin in and a dispersion liquid prepared by swelling and cleaving the inorganic layer compound through the addition of the inorganic layer compound to the solvent are mixed together. Method 2: a dispersion liquid prepared by swelling and cleaving the inorganic layer compound through the addition of the inorganic layer compound to the solvent and a resin are mixed together. Method 3: the inorganic layer compound is swelled and cleaved through the addition of the inorganic layer compound to a solution prepared by dissolving the resin in the solvent. Method 4: the inorganic layer compound and the resin are heat-kneaded and the resulting mixture and the solvent are mixed together.

As the plate, materials may be used which do not dissolve in the solvent (and which are not broken when the peeling described below is done), and therefore, for example, glass, metal, and resin are used. Application may be carried out by means of direct gravure, reverse gravure, micro gravure; roll coating such as two-roll beat coating and bottom-feed three-roll reverse coating; doctor-blade coating, die coating, dip coating, bar coating, and so on. These methods may be used alone or in combination. When the inorganic layer compound is oriented in the surface direction, the coating is preferably carried out by means of roll coating or doctor-blade coating. In the coating, the inorganic layer compound is oriented due to a force (shear force) parallel to the surface of the substrate (for example, the display surface). Drying may be carried out by means of vacuum drying, hot air drying, infrared drying, or the like.

The substrate obtained through the peeling of the layer may be drawn. Drawing may be carried out either uniaxially or biaxially. Through the drawing, the inorganic layer compound is oriented in the surface direction of the substrate.

A substrate having at least two layers may be produced by a method in which the foregoing mixed liquid is applied to a plate, the mixture is dried to form a first layer, a mixed liquid is applied to the first layer, the mixture is dried to form a second layer (any layers are formed by repeating these steps as the need arises), and the layers are peeled off from the plate.

Further, a substrate having at least two layers may be produced by a method in which at least two layers is formed and the layers are laminated on top of each other. In this case, interfaces between the layers may be subjected to corona treatment, treatment with an anchor coating agent, or the like.

In addition, the above-described substrates may be produced by a method in which, for example, the mixture of the solvent, the inorganic layer compound, and the resin is applied to a flexible plate and the mixture is dried.

Flexible Display

A flexible display according to the present invention includes the foregoing substrate and electrodes (an anode and a cathode). The flexible display is, for example, a flexible organic EL display, a flexible liquid crystal display. The flexible organic EL display has usually an anode, a cathode, and a emitting layer and has further (a) an electron-transporting layer between the cathode and emitting layer (having the anode, the emitting layer, the electron-transporting layer, and the cathode in that order), (b) a hole-transporting layer between the cathode and the emitting layer (having the anode, the hole-transporting layer, the emitting layer, and the cathode in that order), or (c) an electron-transporting layer between the anode and the emitting layer and a hole-transporting layer between the anode and the emitting layer (having the anode, the hole-transporting layer, the emitting layer, the electron-transporting layer, and the cathode in that order). For example, the flexible organic EL display (c) may be produced by a method in which the anode, the hole-transporting layer, the emitting layer, and the electron-transporting layer are formed on the foregoing substrate in order, the resulting laminate and the other foregoing substrate on which the cathode is formed are overlaid with each other such that the electrodes (the anode and the cathode) lie at both ends, and the ends are sealed. In this method, either the substrate or the other substrate is transparent.

The anode is made of conductive metal oxides and translucent metallic thin layers, for example, indium oxide, zinc oxide, tin oxide, indium tin oxide (ITO), indium zinc oxide, gold, platinum, silver or copper. The anode may be formed by means of vacuum deposition, sputtering, ion plating, or plating. The anode may be made of a transparent conductive organic layer, for example, polyaniline, polyaniline derivative, polythiophene, or polythiophene derivative.

The hole-transporting layer is made of, for example, polyvinyl carbazole, polyvinyl carbazole derivatives, polysilane, polysilane derivatives, polysiloxane derivatives having aromatic amine compound groups on side chains or main chains, polyaniline, polyaniline derivatives, polythiophene, polythiophene derivatives, poly (p-phenylenevinylene), poly (p-phenylenevinylene) derivatives, poly (2,5-thienylenevinylene), or poly (2,5-thienylenevinylene) derivatives. The hole-transporting layer may be formed by means of applying (a mixed solution of one of these compounds and a polymeric binder is used as the material).

The emitting layer is made of an organic EL material, and may be made of either low-molecular compounds or high-molecular compounds. Examples of the low-molecular compounds include naphthalene derivatives; anthracene; anthracene derivatives; perylene; perylene derivatives; dyes such as polymethine dyes, xanthene dyes, coumarin dyes, and cyanine dyes; 8-hydroxyquinoline; metal complexes of 8-hydroxyquinoline derivatives; aromatic amine; tetraphenylcyclopentadiene; tetraphenylcyclopentadiene derivatives; tetraphenylbutadiene; and tetraphenylbutadiene derivatives (JP-A Nos. 57-51781 and 59-194393). The emitting layer may be formed by vacuum deposition (powder is used the material) or applying (a solution is used as the material). Examples of the high-molecular compounds include poly (p-phenylenevinylene), polyfluorene, and polyparaphenylene derivatives (Jpn. J. Appl. Phys. (1991), vol. 30, p. L1941 and Adv. Mater. (1992), vol. 4, p. 36).

The electron-transporting layer is made of, for example, oxadiazole derivatives, anthraquinodimethane, anthraquinodimethane derivatives, benzoquinone, benzoquinone derivatives, naphthoquinone, naphthoquinone derivatives, anthraquinone, anthraquinone derivatives, tetracyanoanthraquinodimethane, tetracyanoanthraquinodimethane derivatives, fluorenone derivatives, diphenyldicyanoethylene, diphenyldicyanoethylene derivatives, diphenoquinone derivatives, 8-hydroxyquinoline, metal complexes of 8-hydroxyquinoline derivatives, polyquinoline, polyquinoline derivatives, polyquinoxaline, polyquinoxaline derivatives, polyfluorene, and polyfluorene derivatives. The electron-transporting layer may be formed by vacuum deposition (powder is used as the material) or applying (a solution is used as the material).

The cathode is made of material with low work functions, for example, metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, alloys containing at least two selected from the metals, or alloys containing at least one selected from the metals and one or more of gold, silver, platinum, copper, manganese, titanium, cobalt, nickel, tungsten, and tin, graphite, and graphite interlayer compounds. The cathode may be formed by vacuum deposition, sputtering, or thermocompression bonding of the metallic thin film.

In the flexible display, emission patterns can be changed by arrangement of the anode and the cathode. For example, in the flexible display which gives off a plane emission, the plane anode and the plane cathode may be arranged such that they are opposed to each other. In a flexible display which gives off an emission with a specific pattern, a mask having a window with a specific pattern is formed on the surface of the flexible display which gives off a plane emission, the organic layers of the non-emitting portions are formed thickly so as not to substantially give off emission, or one of the cathode and the anode or both is formed so as to have specific patterns. In a segment-type flexible display capable of displaying numerals, letters, and symbols, plural electrodes capable of applying voltage independently may be formed so as to have specific patterns. Further, in a dot matrix-type flexible display, anode is formed in striped form and cathode is formed in striped form so as to be perpendicular to the anode. furthermore, a flexible display capable of partial-color displays and that capable of multi-color displays may be produced by a method of separately applying plural fluorescent materials having mutually different emission colors or using a color filter or a fluorescence conversion filter. The dot matrix-type flexible display may have either a passive driving system or an active driving system (for example, combination with TFTs).

The flexible display is used as displays for computers, televisions, portable terminals, cellular phones, car navigation systems, view finders of video cameras, and so on. Further, since the flexible display is light emitting and thin, the display is suitably used as plane light sources for backlights of liquid crystal displays or plane light sources for lighting fixtures.

EXAMPLE

The following example further illustrates the present invention. However, the example is not intended to limit the scope of the invention. The physical properties of substrates were measured by using the following method.

Average Thermal Expansion Coefficient (ppm/° C.)

The linear thermal expansion coefficients of sample at 20° C. to 150° C. were measured by using a thermal analysis system ("SSC5000" from Seiko Instruments Inc.) on condition that a heating rate is 10° C./min, and then an average thermal expansion coefficient was determined by averaging the linear thermal expansion coefficients.

Average Thermal Expansion Coefficient After Drawing (ppm/° C.)

The samples were doubled in length by drawing them at 200° C. and a rate of 10 mm/min through the use of a strograph manufactured by Shimadzu Corp., after which the samples were thermally fixed at the same temperature for 5 min. Then the linear thermal expansion coefficients (MD and TD) of the central portions of the samples at 20° C. to 150° C. were measured by using the thermal analysis system ("SSC5000" from Seiko Instruments Inc.) on condition that a heating ratio is 10° C./min, and then average thermal expansion coefficients were each determined by averaging the linear thermal expansion coefficients.

Visible Light Transmittance (%)

The total light transmittance of the sample was measured by using a halogen lamp and utilized as visible light transmittance.

Example 1

A three-way cock and a dimroth were attached to the side tubes of a 100 ml three neck flask and a fluororesin agitator was attached to the main tube of the flask. 15 g of polyethersulfone (hereinafter referred to as "PES") (trade name: "PES7600p", Tg: 230° C., manufactured by Sumitomo Chemical Co., Ltd.) and 45 g of N-methyl pyrrolidone (hereinafter referred to as "NMP") were put into the three neck flask and the mixture was stirred at 80° C. for 3 hours to prepare a 25 wt % NMP solution of PES (hereinafter referred to as "solution A").

15 g of organically modified smectite (containing organically modified components of 3.45 g) (trade name: "synthetic smectite STN", manufactured by CO-OP Chemical Co., Ltd., the organically modified components: 23 wt %, average particle diameter: 140 nm) and 45 g of NMP were put into a 100 ml Erlenmeyer flask, dispersed by using a high-speed rotary homogenizer, and then dispersed by an ultrasonic dispersion system to prepare a 25 wt % NMP solution of smectite (hereinafter referred to as "solution B").

10 g of solution A and 6.67 g of solution B were put into a 30 ml lidded bottle. To the resulting solution, NMP was added such that the total amount of PES and smectite (containing the organically modified component) was 20 wt % based on the amount of the contents of the bottle. Then the contents were stirred using the high-speed rotary homogenizer to obtain a mixture of smectite (inorganic layer compound), PES (resin), and NMP (solvent) (hereinafter referred to as "mixture C"). The amount of smectite in the mixture C was 30.8 wt % based on the total amount of smectite and PES.

10 g of solution A and 0.65 g of solution B were put into a 30 ml lidded bottle. To the resulting solution, NMP was added such that the total amount of PES and smectite (containing the organically modified components) was 20 wt % based on the amount of the contents of the bottle. Then the contents were stirred using the high-speed rotary homogenizer to obtain a mixture D. The amount of smectite in mixture D was 4.7 wt % based on the total amount of smectite and PES.

To the washed surface of a glass plate, the mixture C was applied using a doctor blade (gap: 0.24 mm, width: about 8 cm). The mixture was dried under reduced pressure at 190° C. for 10 min to remove the solvent. Thereafter, the glass plate was taken out of the drier and cooled down in room-temperature air for 1 min.

Onto the layer thus formed, the mixture D was applied using a doctor blade (gap: 0.48 mm, width: about 9 cm). The mixture was dried under reduced pressure at 190° C. for 10 min to remove the solvent. Thereafter, the glass plate was taken out of the drier and cooled down in room-temperature air for 1 min.

Then the mixture C was applied thereto by using a doctor blade (gap: 0.72 mm, width: about 10 cm). The mixture was dried under reduced pressure at 190° C. for 10 hr or more to completely remove the solvent. The glass plate was taken out of the drier and a substrate with the three layers containing smectite and PES was obtained.

The substrate had a thickness of 12 μm (the total thickness of the layers formed by applying and drying the mixture C was 8 μm and the thickness of the layer formed by applying and drying the mixture D was 4 μm). The substrate was able to be easily peeled off from the glass plate and had sufficient flexibility.

Before the drawing, the substrate had an average thermal expansion coefficient at 20° C. to 150° C. of 19.7 ppm/° C. and a total light transmittance of 95%. Further, after the drawing the substrate had an average thermal expansion coefficient at 20° C. to 150° C. (MD) of 8 ppm/° C. and an average thermal expansion coefficient at 20° C. to 150° C. (TD) of 12 ppm/° C. In a flexible display including the substrate, its function useful as a display is not impaired despite ambient temperature changes.

Comparative Example 1

Solution A prepared using the same step as that described in Example 1 was applied to the washed surface of a glass plate by using the doctor blade (gap: 0.24 mm, width: about 8 cm). The solution was dried under reduced pressure at 190° C. for 10 min to remove the solvent. Thereafter, the glass plate was taken out of the drier and cooled down in room-temperature air for 1 min.

Onto the layer thus formed, solution A was applied using the doctor blade (gap: 0.48 mm, width: about 9 cm). The solution was dried under reduced pressure at 190° C. for 10 min to remove the solvent. Thereafter, the glass plate was taken out of the drier and cooled down in room-temperature air for 1 min.

Further, solution A was applied thereto by using the doctor blade (gap: 0.72 mm, width: about 10 cm). The solution was dried under reduced pressure at 190° C. for 10 hr or more to completely remove the solvent. The glass plate was taken out of the drier and a substrate with the three layers containing PES was obtained.

The substrate had a thickness of 12 μm, was able to be easily peeled off from the glass plate, and had sufficient flexibility.

Before the drawing, the substrate had an average thermal expansion coefficient at 20° C. to 150° C. of 60 ppm/° C.

The invention claimed is:

1. A substrate for flexible displays comprising a resin composition layer containing an inorganic layered compound and a resin, wherein the amount of the inorganic layer compound is not less than 10 weight % and not more than 70 weight % based on the total amount of the resin and the inorganic layer compound.

2. The substrate according to claim 1, wherein the inorganic layered compound is at least one selected from the group consisting of smectite, kaolinite, dickite, nacrite, halloysite, antigorite, chrysotile, pyrophyllite, montmorillonite, hectorite, tetrasilylic mica, sodium taeniolite, muscovite, margarite, talc, vermiculite, phlogopite, xansophyllite and chlorite.

3. The substrate according to claim 2, wherein the inorganic layered compound is at least one selected from the group consisting of smectite, kaolinite, montmorillonite, hectorite, tetrasilylic mica, sodium taeniolite and talc.

4. The substrate according to claim 1, wherein the inorganic layered compound has an average particle diameter of not more than 300 nm.

5. The substrate according to claim 1, wherein the resin is thermoplastic.

6. The substrate according to claim 1, wherein the resin has a glass transition temperature of not less than 150° C.

7. The substrate according to claim 6, wherein the resin is at least one selected from the group consisting of ethylene-norbornene copolymers, ethylene-domone copolymers, polyethylene terephthalate, polyethylene naphthalate, cellulose triacetate, cellulose diacetate, polyvinylidene chloride, polyvinylidene fluoride, polytetrafluoro-ethylene, polyvinyl alcohol, ethylene-vinyl alcohol copolymers, polycarbonate, polysulfone, polyether sulfone, polyether etherketone and liquid crystal polymers.

8. The substrate according to claim 1, the substrate further comprising other resin composition layer containing an inorganic layer compound and a resin.

9. The substrate according to claim 8, wherein the amount of the inorganic layer compound in the other resin composition layer is not less than 0.1 weight % and not more than 10 weight % based on the total amount of the resin and the inorganic layer compound.

10. A method for producing a substrate for flexible displays comprising applying a mixture of a solvent, an inorganic layer compound, and a resin to a plate, drying the mixture, and peeling off the resulting layer from the plate.

11. A display comprising a substrate for flexible displays comprising a resin composition layer containing an inorganic layer compound and a resin, and electrodes, wherein the amount of the inorganic layer compound is not less than 10 weight % and not more than 70 weight % based on the total amount of the resin and the inorganic layer compound.

12. The display according to claim 11, wherein the resin composition layer has an average thermal expansion coefficient between 20° C. and 150° C. of not less than −10 ppm/° C. and not more than 25 ppm/° C.

13. The display according to claim 11, wherein the resin composition layer has a visible light transmittance of not less than 80%.

14. The use of a resin composition comprising a resin composition layer containing a resin and an inorganic layer compound as a substrate for flexible displays, wherein the amount of the inorganic layer compound is not less than 10 weight % and not more than 70 weight % based on the total amount of the resin and the inorganic layer compound.

* * * * *